United States Patent
Chen et al.

(10) Patent No.: US 6,503,834 B1
(45) Date of Patent: Jan. 7, 2003

(54) PROCESS TO INCREASE RELIABILITY CUBEOL STRUCTURES

(75) Inventors: Xiaomeng Chen, Poughkeepsie, NY (US); Mahadevaiyer Krishnan, Hopewell Junction, NY (US); Judith M. Rubino, Ossining, NY (US); Carlos J. Sambucetti, Croton-on-Hudson, NY (US); Soon-Cheon Seo, White Plains, NY (US); James A. Tornello, Cortlandt Manor, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/677,585

(22) Filed: Oct. 3, 2000

(51) Int. Cl.[7] ............................................. H01L 21/44
(52) U.S. Cl. ..................... 438/687; 438/633; 438/692
(58) Field of Search ..................... 438/687, 690–693, 438/631–633, 648, 650, 685–686, 675, 672

(56) References Cited

U.S. PATENT DOCUMENTS

| | | | | |
|---|---|---|---|---|
| 5,904,557 A | * | 5/1999 | Komiya et al. | 438/633 |
| 6,028,362 A | * | 2/2000 | Omura | 257/774 |
| 6,086,454 A | * | 7/2000 | Watanabe et al. | 451/36 |
| 6,117,775 A | * | 9/2000 | Kondo et al. | 438/690 |
| 6,140,239 A | * | 10/2000 | Avanzino et al. | 438/692 |
| 6,169,034 B1 | * | 1/2001 | Avanzino et al. | 435/693 |
| 6,218,290 B1 | * | 4/2001 | Schonauer et al. | 438/633 |
| 6,261,952 B1 | * | 7/2001 | Ngo et al. | 438/687 |
| 6,265,781 B1 | * | 7/2001 | Andreas | 257/765 |
| 6,303,551 B1 | * | 10/2001 | Ii et al. | 438/633 |

* cited by examiner

Primary Examiner—Tuan H. Nguyen
Assistant Examiner—Thanh Nguyen
(74) Attorney, Agent, or Firm—Connolly Bove Lodge & Hutz, LLP; Robert M. Trepp, Esq.

(57) ABSTRACT

The invention provides a process to increase the reliability of BEOL interconnects. The process comprises forming an array of conductors on a dielectric layer on a wafer substrate, polishing the upper surface so that the surfaces of the conductors are substantially co-planar with the upper surface of the dielectric layer, forming an alloy film on the upper surfaces of the conductors, and brush cleaning the upper surfaces of the conductors and the dielectric layer.

16 Claims, 6 Drawing Sheets

US 6,503,834 B1

PROCESS TO INCREASE RELIABILITY CUBEOL STRUCTURES

FIELD OF THE INVENTION

The present invention relates generally to integrated circuits, and particularly, but not by way of limitation, to copper BEOL structures.

BACKGROUND

Chemical Mechanical Polishing (CMP) is widely used in the prior art to planarize insulating dielectrics in the top most semiconductor chip layers, i.e, those closest to the chip's upper surface. These top most layers are sometimes called Back End Of the Line (BEOL) layers, likening the semiconductor chip manufacturing process to an assembly line where these steps occur at the back of the line. Copper is typically used to wire BEOL structures because of its good conductivity properties. However, copper suffers from poor adhesion to dielectrics and also suffers from a tendency to be degraded by electromigration.

In order to stabilize the copper surface, to enhance the adhesion of copper to dielectrics and most importantly, to reduce the tendency towards electromigration, a thin coating of a composit alloy is deposited on the copper lines. This alloy is typically a cobalt-phosphorous ternary, preferably containing W or Sn, and typically applied to about 75 to 100 Å thick.

However, during the electroless deposition process, particles of metal are generated in the bath which tend to deposit on the Cu lines and also in the (free) dielectric space in between lines. These particles can be approximately 500–2000 Å in size and they create resistance drops and even true electrical shorts causing circuit failure and decrease process yields. The present invention eliminates these loose particles by immediately following the plating cycle with a brush cleaning step which removes most of the unwanted particles, thus restoring the electrical integrity of the chip.

The main object of this invention is to provide a thin alloy metal coating (75–100 Å hick) on the Cu lines of Back-end-of-Line (BEOL) structures, after CMP, in such a way hat the Cu lines are clean and free of loose metal particles in between them to insure that the Cu circuit will not present electrical shorts. The overall invention consists of a dual process involving a) the deposition of the alloy capping layer and b) a brush cleaning step to insure the removal of free metal particles in between circuit lines.

It is known in the prior art to use solutions containing organic solvents or acids to remove unwanted metal particles. Such solutions are associated with environmental disposal problems, and are avoided by the present invention.

SUMMARY OF INVENTION

The invention provides a means to increase the reliability of Cu-BEOL interconnects by first providing a thin alloy coating on copper BEOL structures and removing contaminant metal particles thereby reducing the number of interline shorts.

The invention comprises a dual process involving (a) the electroless deposition of a cobalt-phosphorous ternary capping film over the CuBEOL, and (b) brush-cleaning and surfactant flotation of free metal particles from between circuit lines.

The invention comprises the steps of:

forming an array of conductors on a dielectric layer on a wafer substrate;

polishing the upper surface of said conductors so that said upper surface of the conductors is substantially co-planar with the upper surface of the dielectric layer;

forming a cobalt-phosphorus-containing ternary alloy film on the upper surface of the conductors; and brush cleaning the upper surfaces of the conductors and of the dielectric layer. The brush comprises soft polymer fibers, preferably polyvinyl alcohol and the brushing process incorporates a tincture or an aqueous solution of a surfactant.

The present invention eliminates the use of prior art solvents and acids for removing residues from semiconductor surfaces. The cleaning solution of this invention is aqueous, non flammable and DI water drain compatible (no special EPA handling is required).

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF A PREFERRED EMBODIMENT

Reference is made to the figures to illustrate selected embodiments and preferred modes of carrying out the invention. It is to be understood that the invention is not hereby limited to those aspects depicted in the figures.

Figure 1:
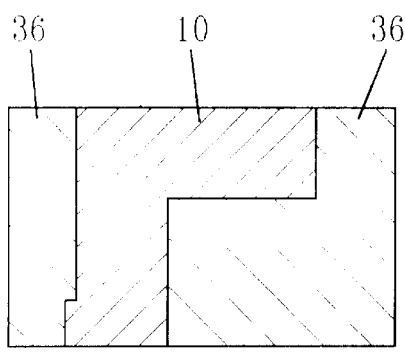
FIGS. 1–4: Interconnect BEOL structure build sequence.

Now turning to FIG. 1, which shows the interconnect completed through the deposition of copper line 10 and planarization, typically by a CMP process.

Figure 2:
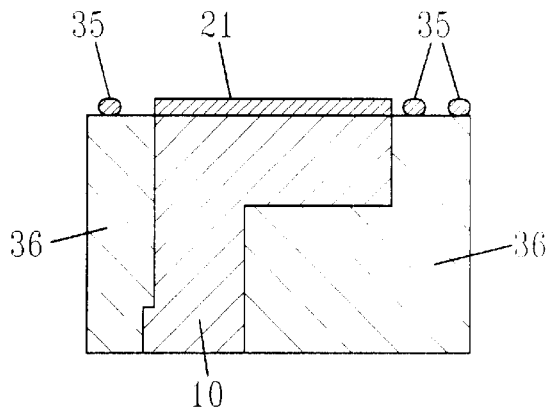

Turning to FIG. 2, the structure after application of a cobalt-phosphorus ternary cap 21. The ternary alloy preferably contains W or Sn. The wafer is cleaned in dilute sulfuric acid, to remove oxides from the copper surface, and is rinsed in distilled water. The wafer is immersed in a solution of Pd in dilute sulfuric acid and rinsed in distilled water. The wafer is immersed in aqueous sodium citrate, preferably about 30 g/l, pH 8 to 9, followed by a distilled water rinse. Electroless deposition is achieved by immersion in a plating bath comprising an aqueous solution of a cobalt sulfate salt, preferably $CoSO_4 \cdot 7H_2O$ at from about 7 to about 9 g/l;

sodium citrate, from about 25 to about 35 g/l; boric acid, preferably about 25 g/l, sodium hypophosphite, from about 8 to about 10 g/l; either ammonium tungstate, from about 2 to about 5 g/l, or sodium stannate, from about 1 to about 3 g/l; and surfactant from about 0.05 to about 0.01 g/l. Preferably, deposition occurs at a temperature of about 72–74° C. and a pH of about 8.5 to 9. The surfactant may be non-ionic or anionic and is preferably an anionic fluorosurfactant such as FC95 or FC98 (Trademark of the 3M Corporation) and is included preferably at a concentration of 0. 1 g/l.

Electroless deposition is followed by a brush-cleaning cycle. During this step, the wafer is placed in a special tool consisting of a roller brush cleaner for the removal of unwanted particles and other residues. In this tool the wafer is rotated at a certain speed while a system of soft brushes passes over the wafer surface. The speed of wafer rotation, the pressure of the brush on the wafer and the cycle time are optimized to achieve maximum cleaning efficiency and the total removal of unwanted particles, without affecting the integrity of the lines The brushes are made of soft polymer fiber material, preferably of polyvinyl alcohol, so as not to produce any scratches or any other damage on the wafer surface. Brush cleaning is done under wet conditions and it is also advisable to use a dilute, pure aqueous or alcohol solution (tincture) of a surfactant, such as FC95, FC98 or the like, in order to reduce the surface tension of the medium and to facilitate the flotation and quick removal of particles from the wafer.

Transmission Electron Microscopy (TEM) analysis of the surface of the wafer carried out before and after brush cleaning revealed that the thickness of the electroless layer was not affected by the process. The process of the present invention eliminates the use of prior art solvents or acids for removing residues from a precision semiconductor surface.

Figure 3:
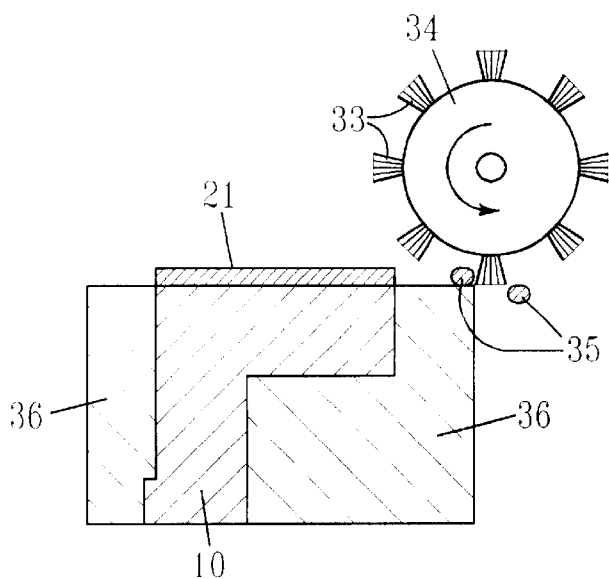

With reference to FIG. 3, the wafer 36 is placed in a special tool consisting of a wafer holder that rotates the wafer. The speed of rotation is from about 10 to about 25 RPM and is preferably 18 RPM, but may vary greater than or less than that speed. The rotating wafer is pressed between a set of rotating roller brushes. The figure depicts the upper brush 34, not shown is the lower brush. Each of the brushes has soft polymer fiber bristles 33 that mechanically sweep the stray particles 35 from the surface of the wafer 36. The bristles 33 preferably are polyvinyl alcohol so as not to produce scratches or other damage to the wafer surface. The roller brushes rotate at from about 30 to about 50 RPM with a prefered rotation speed of about 40 RPM. The brush pressure is adjusted by bringing the top and bottom rollers into contact such that the bristles are compressed by about 1 millimeter in the absence of the wafer.

Figure 4:
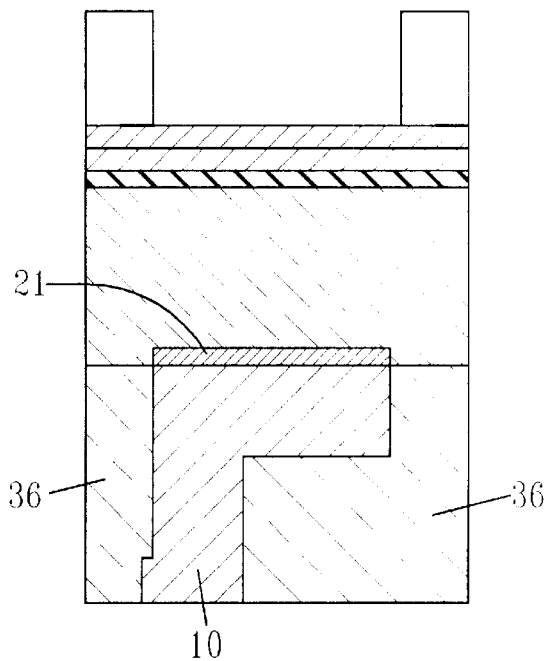

Turning now to FIG. 4, each layer of the structure involves a similar brush-cleaning step. Each layer of the structure would comprise a cycle of plating a copper line, CMP polishing, capping the line, and brush cleaning.

Figure 5:
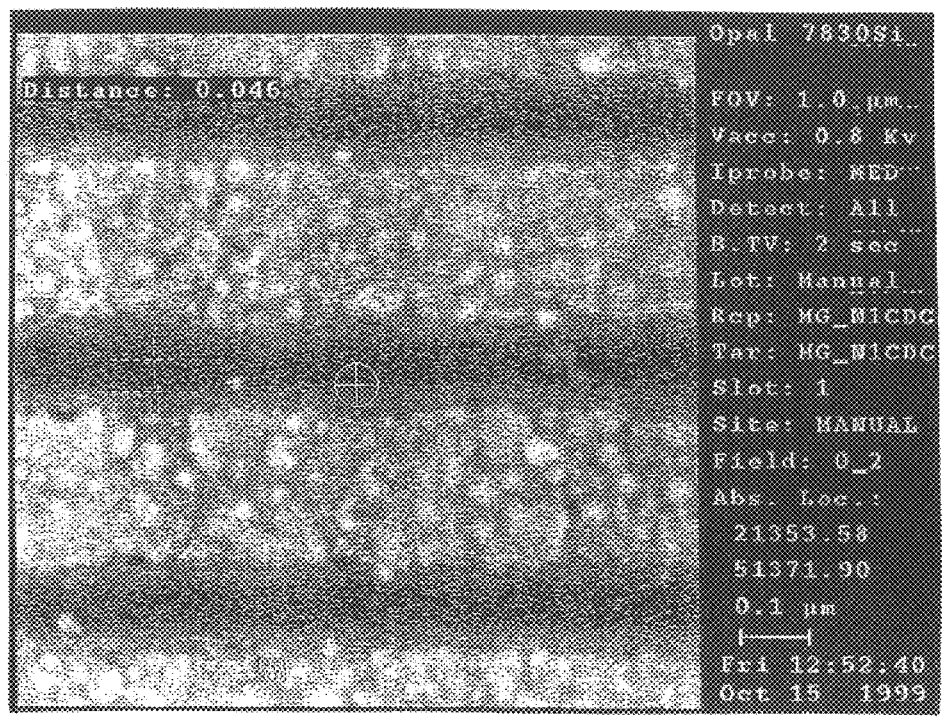
FIG. 5: CoWP Capped Wafer Prior To Brush Clean.
Figure 6:
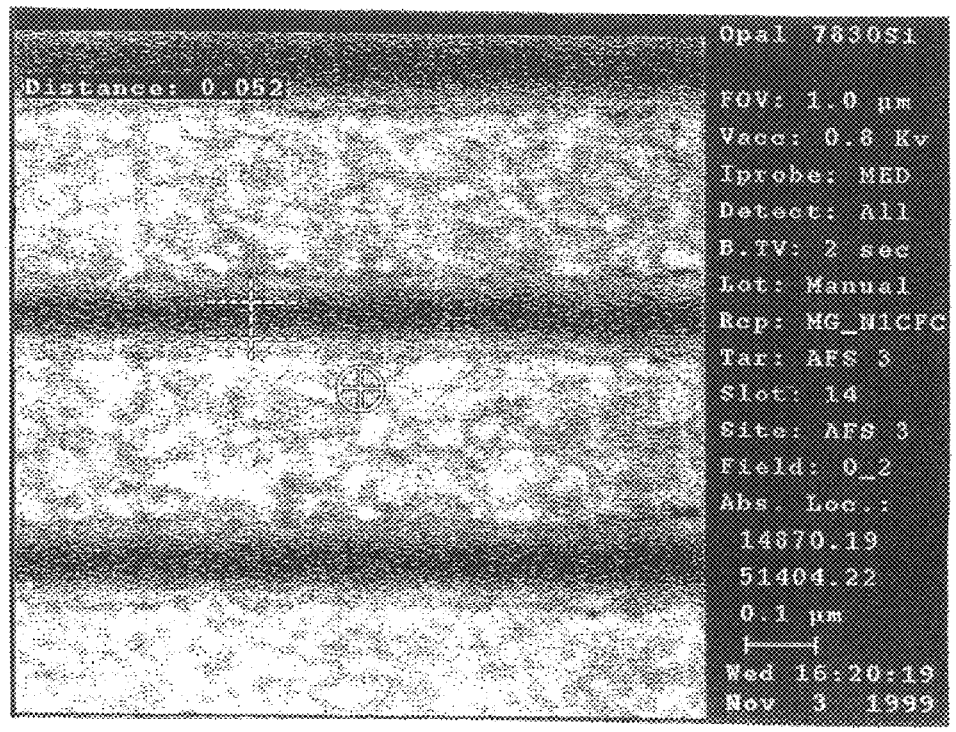
FIG. 6: CoWP Capped Wafer Post Brush Clean.
Figure 7:
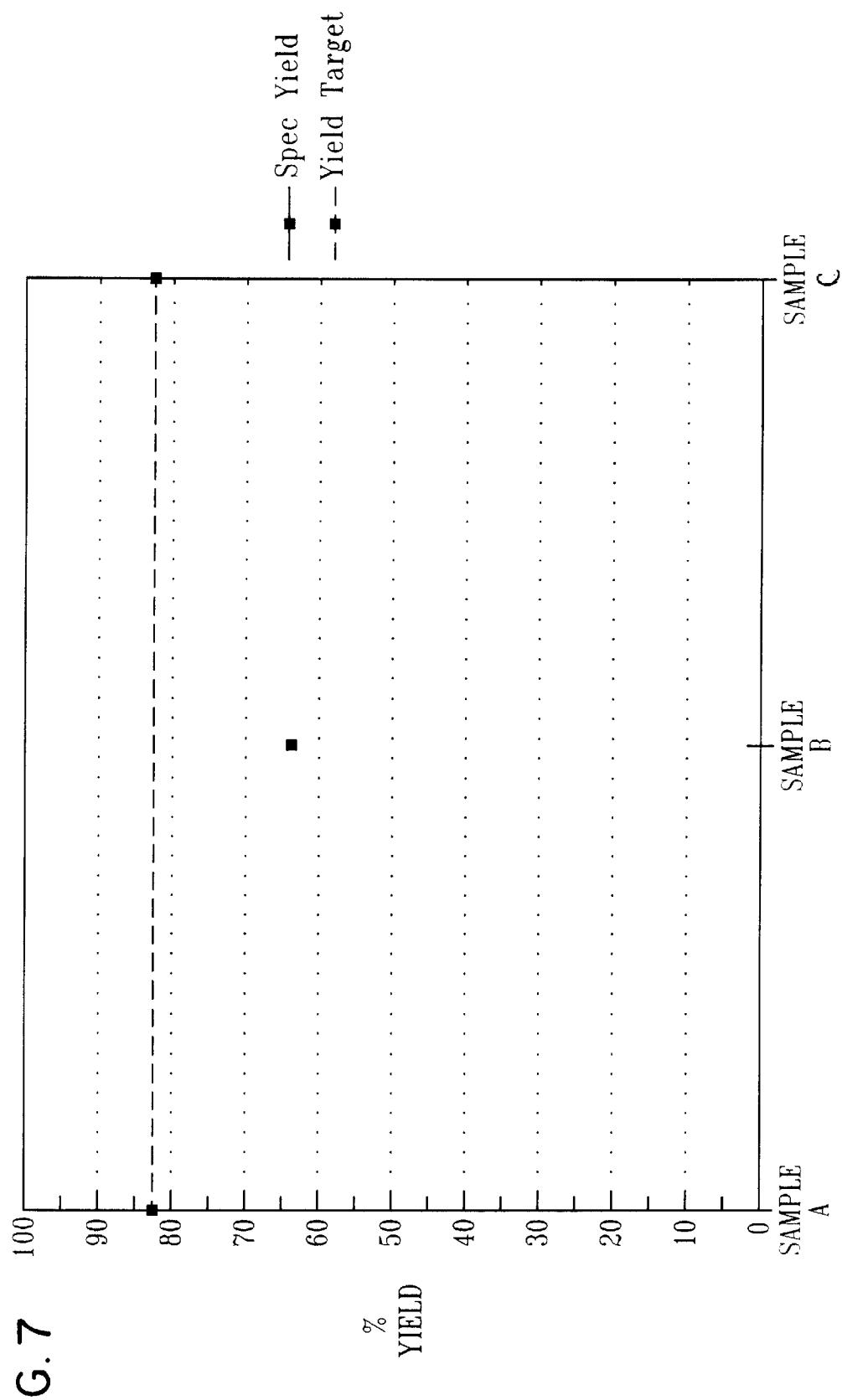
FIG. 7: Wafer Shorts Test Pre-Cap.
Figure 8:
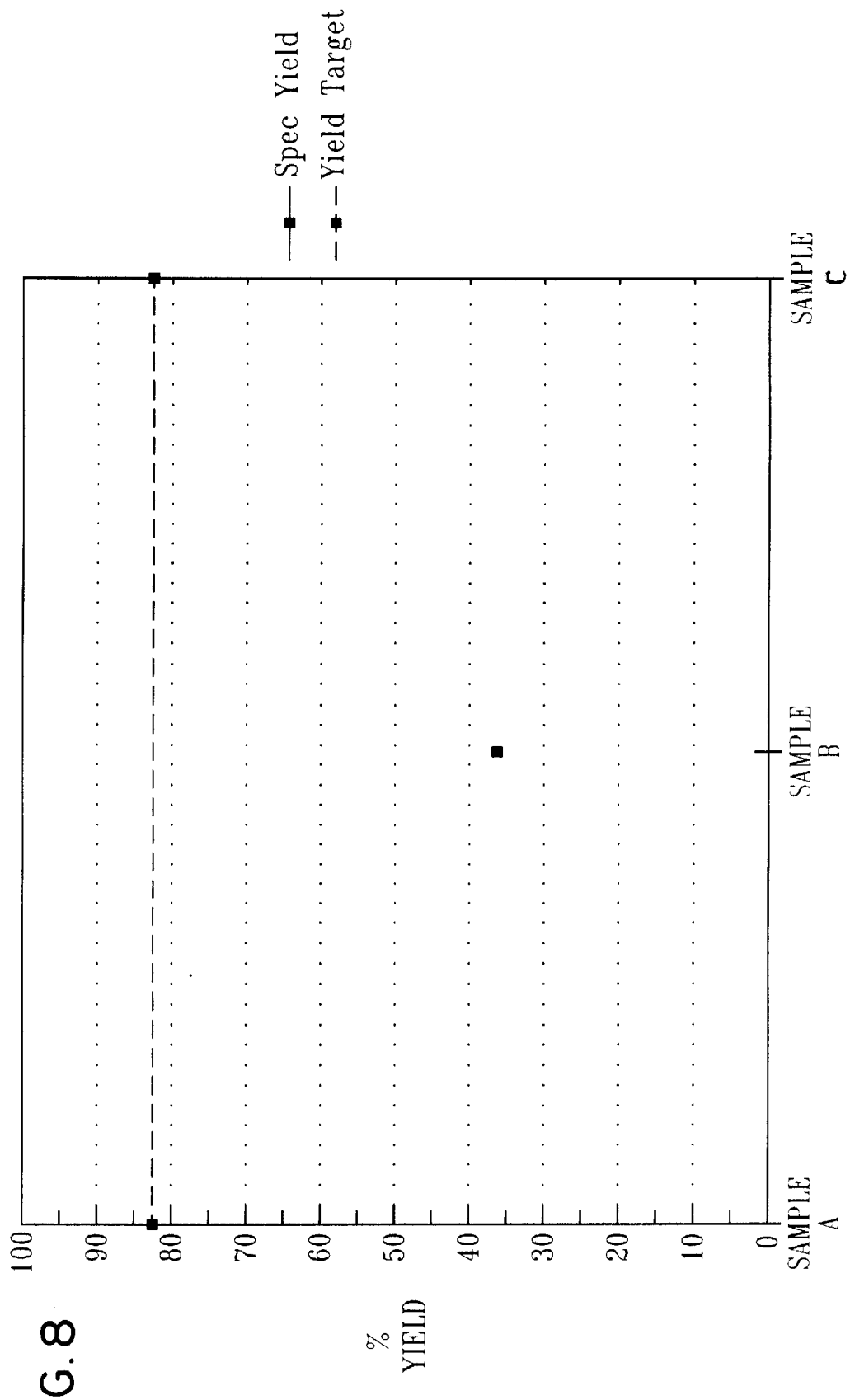
FIG. 8: Wafer Shorts Test Post-Cap, No Clean.
Figure 9:
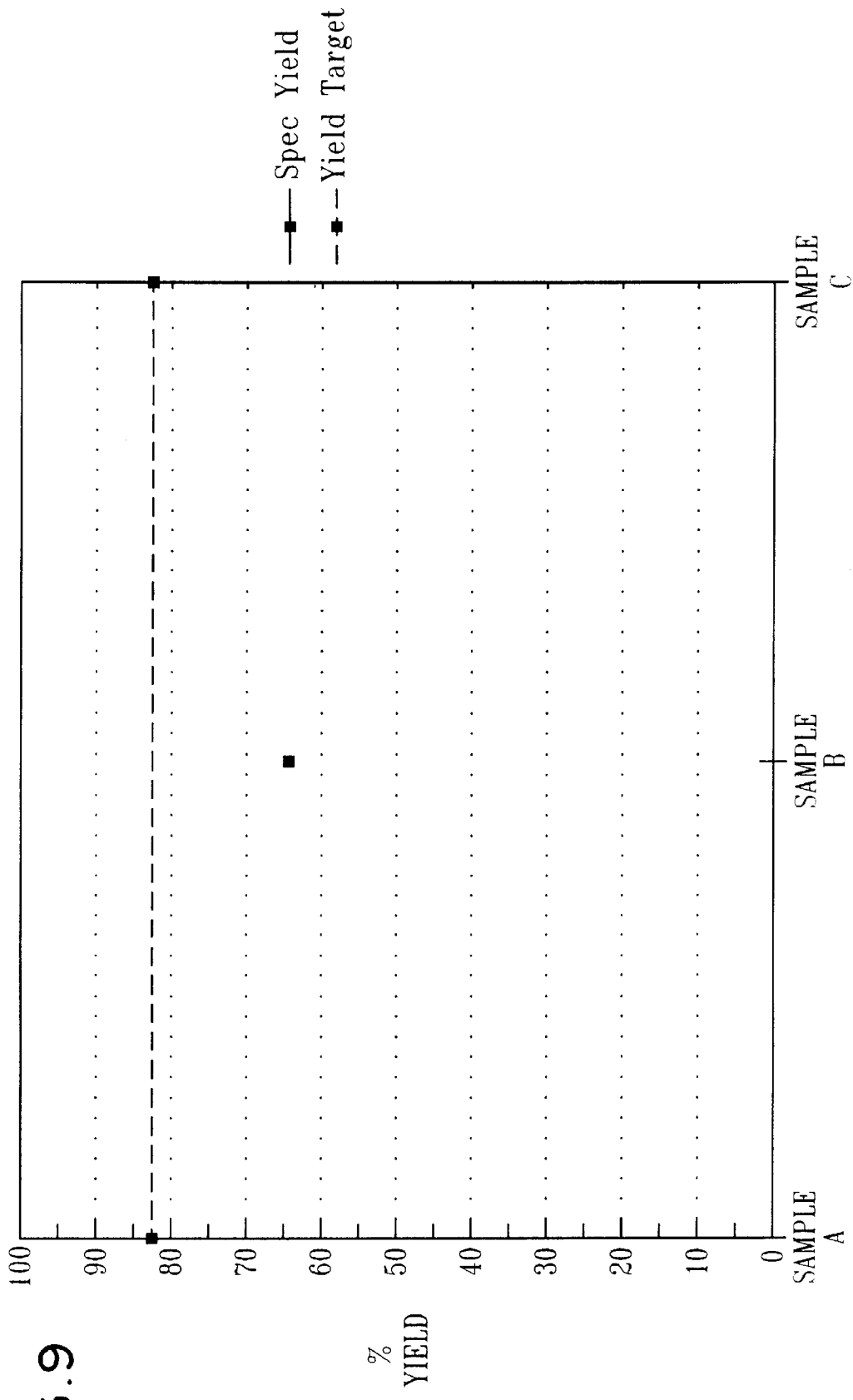
FIG. 9: Wafer Shorts Test Post-Cap, After Brush-Clean.

High magnification, top Scanning Electron Microscopy (SEM) pictures of the copper lines in BEOL are shown in FIGS. 5 and 6. FIG. 5 is the top SEM of the lines right after the CoWP capping layer was deposited and before brush cleaning. FIG. 6 shows the same SEM pattern after the brush cleaning was applied.

As can be seen from FIG. 5, there are a number of particles sitting in between the copper lines and some loose on top of the circuitry. These particles are rather large, of the order of about 500 Å and they can almost bridge the space between lines (1000 Å) causing lower resistance and even bridging between the lines.

On the contrary, as shown in FIG. 6, after brush cleaning has taken place, no particles are seen around the circuitry and all the debris has disappeared, showing a clean dielectric spacing between the lines. The electrical measurements at the chip level before and after brush cleaning are discussed below.

The sequence of graphical plots 1–8 shows the short currents comparison (per chip) in a wafer that was electroless plated with 75 Å CoWP. The graphs particularly show a) current test at each chip before capping, b) after capping and no brush cleaned, and c) after capping and post brush cleaning. If the chip current is higher than $10^6$ units ampere, it indicates a serious short. Good values for acceptable yields are between $10^9$, and $10^{10}$–$10^{11}$ amperes. Most of the chips tested before electroless capping gave values between $10^{10}$–$10^{11}$ amperes. After capping (graph number 3), shows severe degradation on the chip currents with values of $10^6$. This gives a yield decrease of 26%. Finally, after brush cleaning (graph 7), it is seen that the shorts yield has improved considerably, due to the removal of the particles causing shorts.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A process to increase the reliability of Cu-BEOL interconnects comprising:

forming an array of conductors on a dielectric layer on a wafer substrate;

polishing the upper surface of said conductors so that said upper surface of said conductors is substantially co-planar with the upper surface of said dielectric layer;

forming an alloy film on said upper surface of said conductors;

providing an amount of an acid-free surfactant solution to said upper surface; and brush cleaning the upper surfaces of said conductor and of said dielectric layer.

2. The process of claim 1 wherein the conductors comprise copper or copper alloys.

3. The process of claim 1 wherein the alloy film is formed by electroless deposition.

4. The process of claim 1 wherein the alloy film comprises a cobalt phosphorus ternary.

5. The process of claim 1 wherein the alloy film comprises CoWP.

6. The process of claim 1 wherein the alloy film comprises CoSnP.

7. The process of claim 1 wherein the alloy film elements selected from the group consisting of Cu, Co, W, P, and Au.

8. The process of claim 1 wherein the alloy film has a thickness of from about 75 angstroms to about 100 angstroms.

9. The process of claim 1 wherein brush cleaning comprises:
providing a set of rotating roller brushes comprising an upper brush and a lower brush each said brush having bristles wherein said bristles comprise soft polymer fibers, and wherein said upper and said lower brush are contacted such that said bristles of said brushes flex by about 1 millimeter;
wetting the surface of said wafer with said surfactant solution; and
rotating said wafer while passing said wafer between said set of roller brushes.

10. The process of claim 9 wherein said surfactant solution comprises surfactant and wherein the solvent of said solution is selected from the group consisting of water and alcohol.

11. The process of claim 9 wherein said surfactant is non-ionic or anionic.

12. The process of claim 9 wherein said surfactant is selected from the group consisting of FC95 and FC98.

13. The process of claim 9 wherein the brushes comprise polyvinyl alcohol fibers.

14. The process of claim 9 wherein the brushes rotate at a speed from about 30 RPM to about 50 RPM.

15. The process of claim 9 wherein the wafer is rotated at a speed from about 10 RPM to about 25 RPM.

16. The process of claim 9 wherein said wafer is rotated at a speed of about 18 RPM.

* * * * *